(12) United States Patent
Nakamura et al.

(10) Patent No.: US 8,803,190 B2
(45) Date of Patent: Aug. 12, 2014

(54) SEMICONDUCTOR DEVICE

(71) Applicant: Fuji Electric Co., Ltd., Kawasaki (JP)

(72) Inventors: Hiroshi Nakamura, Matsumoto (JP);
Shigemi Miyazawa, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 13/854,506

(22) Filed: Apr. 1, 2013

(65) Prior Publication Data

US 2013/0256746 A1    Oct. 3, 2013

(30) Foreign Application Priority Data

Apr. 2, 2012 (JP) ................... 2012-083931

(51) Int. Cl.
*H01L 29/74* (2006.01)
*H01L 31/111* (2006.01)

(52) U.S. Cl.
USPC ............................ 257/140; 257/326; 257/341

(58) Field of Classification Search
USPC ...................... 257/140, 326, 341, 606, E27.06
See application file for complete search history.

(56) References Cited

U.S. PATENT DOCUMENTS

| | | |
|---|---|---|
| 5,070,322 A | 12/1991 | Fujihira |
| 5,221,850 A | 6/1993 | Sakurai |
| 6,229,180 B1 | 5/2001 | Yoshida et al. |
| 6,323,518 B1 * | 11/2001 | Sakamoto et al. ............ 257/330 |
| 2009/0139505 A1 | 6/2009 | Naito et al. |
| 2011/0278669 A1 * | 11/2011 | Miyoshi et al. ............... 257/335 |
| 2012/0299108 A1 * | 11/2012 | Harada et al. ................ 257/355 |

FOREIGN PATENT DOCUMENTS

| | | |
|---|---|---|
| JP | 04-291767 A | 10/1992 |
| JP | 05-129598 A | 5/1993 |
| JP | 11-284175 A | 10/1999 |
| JP | 2009-138547 A | 6/2009 |

* cited by examiner

*Primary Examiner* — Phuc Dang

(74) *Attorney, Agent, or Firm* — Rossi, Kimms & McDowell LLP

(57) ABSTRACT

Aspects of the invention can include a semiconductor device that includes an output stage IGBT and a Zener diode on the same semiconductor substrate. The IGBT can include a first p well layer, an n emitter region on the surface region of the first p well layer, a gate electrode deposited on a gate insulating film, and an emitter electrode on the emitter region. The Zener diode can include a $p^+$ layer formed in the surface region of a second p well layer in the place different from the first p well layer and has a higher concentration than the second p well layer, an anode electrode in ohmic contact with the surface of the $p^+$ layer, an $n^-$ layer having a lower concentration than the second p well layer, and a cathode electrode in Schottky contact with the surface of the $n^-$ layer.

6 Claims, 15 Drawing Sheets

SEMICONDUCTOR DEVICE

BACKGROUND OF THE INVENTION

1. Field of the Invention

Embodiments of the invention relate to semiconductor devices that provide a surge voltage protecting function.

2. Description of the Related Art

FIG. 9 is a circuit diagram of a conventional ignition device for an internal combustion engine for vehicles. This conventional ignition device for an internal combustion engine for vehicles includes an engine control unit (or an electronic control unit ECU) 21, an ignition IC (integrated circuit) 22 indicated with a square of dotted lines, an ignition coil 27, a voltage source 30, and an ignition plug 31. The ignition IC 22 employed in the ignition device for an internal combustion engine uses an insulated gate bipolar transistor (IGBT) 25 for an output stage switching element to control switching of primary side current of the ignition coil. A sensing IGBT 25a is provided having a gate and a collector that are commonly connected to the output stage IGBT 25. A current sensing resistor 26 is connected in series to the emitter of the sensing IGBT 25a. The resistor 34 in FIG. 9 indicates a wiring resistance.

Actual operation of the ignition device for an internal combustion engine will be described mainly concerning the ignition IC 22. The voltage source 30, which is connected to one terminal of the primary coil 28 of the ignition coil 27, supplies a constant voltage, for example 14 V that is a car battery voltage. The other terminal of the coil 28 is connected to the collector terminal (C terminal) of the ignition IC 22, the emitter terminal (E terminal) of the ignition IC 22 is connected to the ground, and the gate terminal (G terminal) is connected to the ECU 21. The ignition IC 22 comprises main components of the output stage IGBT 25 working as a switching element and the current control circuit 24 for the IGBT 25. The ECU 21 delivers signals for controlling ON and OFF of the output stage IGBT 25 and the sensing IGBT 25a of the ignition IC 22, and the signals are given to the G terminal of the ignition IC 22. When a voltage Vg at 5 V, for example, that is larger than the threshold value is given to the G terminal, the output stage IGBT 25 and the sensing IGBT 25a of the ignition IC 22 turn ON, while when a voltage Vg at 0 V, for example, that is smaller than the threshold value is given to the G terminal, the IGBTs 25 and 25a turn OFF.

When an ON signal Vg at 5 V is given to the G terminal from the ECU 21, the output stage IGBT 25 and the sensing IGBT 25a turn ON and decrease the voltage Vce between the C terminal and the E terminal. Thus, a collector current Ic begins to flow from the battery voltage source 30 through the primary coil 28 of the ignition coil 27 in the circuit between the C terminal and the E terminal of the ignition IC 22. The collector current Ic increases at a rate dI/dt that is determined by the inductance of the primary coil 28 and the voltage applied to the primary coil 28. After reaching a certain current value that is controlled by the control circuit 24, the collector current Ic is held at a constant current value for example 13 A. In operation of the control circuit 24 to hold the collector current Ic at a constant value, as shown in detail in FIG. 10, a voltage drop across a sensing resistor 26 is detected in proportion to the collector current Ic. The operational amplifier 36 controls the gate voltage of the MOSFET 37 such that the detected voltage drop equals a predetermined reference voltage 35. This controls the gate voltages of the output stage IGBT 25 and the sensing IGBT 25a. Thus, the collector current Ic is controlled at the constant value.

The control circuit 24 can be provided with a terminal that controls the gate voltages of the IGBT 25 and the IGBT 25a in the case of abnormal collector current and delivers warning signal to the ECU 21, though not illustrated in the FIG.

The control circuit 24 can have a built-in circuit for detecting abnormality of the coils 28 and 29 by sensing the voltage across the sensing resistor 26, though not illustrated in the FIG. The abnormality detection circuit for the coils 28 and 29 detects sharp build-up dv/dt of the collector voltage at the turn OFF time of the IGBT 25. More specifically, the gate voltage of the output stage IGBT 25 is pulled down by a predetermined voltage and the gate voltage of the IGBT is detected by the ECU 21 to detect abnormality of the coil. Alternatively, a warning signal is delivered by pulling down the voltage at the terminal that is connected to the reference voltage of the ECU 21. Japanese Unexamined Patent Application Publication No. 2009-138547 (also referred to herein as "Patent Document 4"), for example, discloses about an abnormality-detecting circuit for the coil.

Referring to FIG. 9, when an OFF signal Vg at 0 V is given from the ECU 21 to the G terminal, the output stage IGBT 25 of the ignition IC 22 is opened (or turned OFF) and the collector current Ic decreases abruptly. Corresponding to the abrupt change dI/dt of the collector current Ic, high voltage develops abruptly across the primary coil 28. At this moment, the secondary coil 29 also generates a high voltage of several tens of kilovolts, for example 30 kV, in proportion to the coil winding ratio. This voltage is applied to the ignition plug 31, which discharges at an applied voltage higher than about 10 kV.

The operation of the ignition device for an internal combustion engine will be described referring to operational waveforms in FIGS. 3A and 3B. As shown in FIG. 3A, when the gate voltage Vg reaches the threshold value and the output stage IGBT 25 turns ON, the collector current Ic begins to flow at a predetermined rate and the collector voltage Vc decreases immediately. After a certain time duration, the collector current Ic is controlled at a constant current value by the control circuit 24. The part encircled by the broken line at the right of the FIG. 3A corresponds to a transient state in the turning OFF time of the output stage IGBT 25. FIG. 3B shows this part with an expanded time scale of the abscissa.

As shown in FIG. 3B, when the gate voltage Vg falls down to a low value, 0 V, for example, below the threshold value and the output stage IGBT 25 turns OFF, the collector current Ic begins to decrease after a certain delay time. This delay time occurs due to the gate capacitance and the gate resistance 23 of the output stage IGBT 25. Accompanying the decrease of the collector current Ic, the collector voltage Vc rises abruptly. Although the increased collector voltage Vc is clamped by the Zener diode 33 indicated in FIG. 9, the discharge of the ignition plug occurs during this period.

Concerning the output stage IGBT 25, which is a switching element used in the ignition IC 22, high reliability is necessary about the withstand capability against surge voltages subjected by the IGBT 25 at the terminals of collector C, emitter E, and the gate G. The Zener diode 32 provided for the purpose of protecting the gate of the output stage IGBT 25 in FIG. 9, for example, clamps surge voltage of electrostatic discharge (ESD) from the ECU 21 generated by workers or machinery and protects the gate.

The Zener diode 32 for protecting the gate is, as shown in FIG. 4, can be a lateral Zener diode 132 formed by depositing polysilicon on the surface of the IGBT substrate in the ignition IC. This lateral polysilicon Zener diode 132 can be manufactured, for example, by the following procedure. On the n⁻ epitaxial layer 11 indicated in FIG. 4 formed is an oxide film 5, on which a polysilicon gate electrode 6 is formed and simultaneously, a polysilicon layer for the Zener diode is deposited. Ion implantation into this polysilicon layer forms a PN junction consisting of an n⁺ layer 4, an n⁻ layer 3, and a p⁺ layer 1. Then an anode electrode A and a cathode electrode K are formed, and the anode electrode A is connected to the emitter electrode E of the IGBT 25 and the cathode electrode K is connected to the gate electrode G at a respective common electric potential. The lateral polysilicon Zener diode 132, with a withstand voltage of 6 V, for example, and connected between the gate and the emitter, can clamp surge voltages over 6 V performing gate protection.

To meet the requirement for cost reduction, an ignition IC with a reduced chip size has been developed that includes a vertical Zener diode, not a lateral one, built-in with an IGBT. The advantages of the vertical Zener diode include a small surface area of the Zener diode owing to a PN junction of the Zener diode formed below the surface of the semiconductor surface (or the surface of the n-epitaxial layer 11). FIG. 5 is a sectional view of an essential part of an example of a compound device in a single chip comprising a Zener diode and an IGBT formed on one and the same semiconductor substrate in a self-separating structure.

In the compound device of the vertical Zener diode and the IGBT shown in FIG. 5, a p well layer 2 is formed on the surface region of the n-epitaxial layer 11 in a different place from the IGBT region. A p+ layer 1 and an n+ layer 4 are formed from the surface of this p well layer 2. On the surface of the thus formed p+ layer 1 and the n+ layer 4, an oxide film 5 and an interlayer dielectric film 7 are formed. The oxide film 5 and the interlayer dielectric film 7 on the p+ layer 1 and the n+ layer 4 are selectively processed for forming openings, and an emitter electrode (that is an anode electrode) is formed on the p+ layer 1 and a gate electrode (that is a cathode electrode) is formed on the n+ layer 4. The emitter electrode and the gate electrode perform an ohmic contact with the p+ layer 1 and the n+ layer 4, respectively. This manufacturing process forms the IGBT 25 and a vertical Zener diode 142 including the p+ layer 1, a p well layer 2, and the n+ layer 4, and having a pn junction that consists of the p well layer 2 and the n+ layer 4 and conducts electric current in the vertical direction.

Concerning a device including a Zener diode or a surge protecting element, Japanese Unexamined Patent Application Publication No. H11-284175 (also referred to herein as "Patent Document 1") discloses a MOS type semiconductor device having a PN junction elongated for the purpose of raising surge-withstanding voltage of a lateral polysilicon Zener diode formed on a semiconductor substrate.

Japanese Unexamined Patent Application Publication No. H04-291767 (also referred to herein as "Patent Document 2") discloses a method of eliminating the difficulties in selecting a withstand voltage of an externally provided Zener diode for voltage clamping by means of a clamping transistor for an IGBT, the clamping transistor being a bipolar transistor comprising a p⁺ layer, n⁻ layer, and a p⁺ collector layer formed on the surface region of an n⁻ layer.

Japanese Unexamined Patent Application Publication No. H05-129598 (also referred to herein as "Patent Document 3") discloses a device comprising a PN junction and a depletion type MOSFET, the PN junction being formed on the same substrate of a power MOSFET in self-isolation, connected to the GND at the N side of the junction, and series-connected to the depletion type MOSFET.

In order to increase the surge withstand voltage of the lateral polysilicon Zener diode 132 shown in FIG. 4, however, operation resistance must be decreased. Nevertheless, since this lateral polysilicon Zener diode 132 has a thin film structure, small operation resistance needs an increased area of the PN junction. A large area of PN junction requires a large planar area dedicated to the lateral polysilicon Zener diode 132 on the semiconductor substrate. This causes increased chip cost.

On the other hand, in the case the vertical Zener diode 142 of FIG. 5 is used for a gate protection Zener diode 32, supposing a wiring resistance 34 between the E terminal and the ground in FIG. 9 is 0.1 ohm, the electric potential at the emitter increases by about 2 V with respect to the ground potential for a collector current of the IGBT 25 of 20 A. Due to the increase of the emitter potential, the potential of the p well 2 (indicated in FIG. 5), which is made at the same potential as that of the emitter, also increases by the same value of 2 V. In the conventional vertical Zener diode 142 shown in FIG. 5, even when the input voltage to the gate on the surface of the n⁺ layer 4 is 0 volts (that is the case an OFF voltage is given onto the collector (*1) of the IGBT), the emitter potential, which is at 2 V, is higher than the built-in voltage (*2) 0.7 V, for example, of the PN junction between the p well layer 2 and the n⁺ layer 4. This causes electric current flowing between the emitter and the gate. This current serves as a gate current for a parasitic thyristor consisting of the p substrate 9, the n⁺ epitaxial layer 10, the n⁻ epitaxial layer 11, p well layer 2, and the n⁺ layer 4, turning ON the parasitic thyristor. As a result, uncontrollable current runs causing latch-up breakdown. When a vertical Zener diode 142 is used for the gate protection Zener diode 32 in FIG. 9, the Zener diode 32 needs to perform a bidirectional blocking characteristic to block the emitter potential raised by the current running through the wiring resistance. This bidirectional blocking characteristic needs to be achieved at a low cost. Thus, as described above, there are needs in the art for improved semiconductor devices.

SUMMARY OF THE INVENTION

Embodiments of the invention address these and other needs. Some embodiments include an IGBT and a Zener diode that performs protecting the IGBT from surge voltage. The IGBT can include a first well layer of a second conductivity type formed in a surface region of a first conductivity type semiconductor layer on a first principal surface of a second conductivity type semiconductor layer; an emitter layer of the first conductivity type selectively formed in a surface region of the first well layer; a gate electrode covering a part of surface of the emitter layer and a part of surface of the first well layer through a gate insulating film; an emitter electrode in contact commonly with the surface of the emitter layer that is not covered with the gate electrode and the surface of the first well layer; and a collector electrode in contact with a second principal surface of the second conductivity semiconductor layer. The Zener diode can include a second well layer of the second conductivity type formed in the surface region of the first conductivity type semiconductor layer on the first principal surface of the second conductivity type semiconductor layer, the second well layer being disposed apart from the first well layer; an anode electrode in ohmic contact with a surface of a second conductivity type layer that is in contact with the second well layer and has a higher impurity concentration than the second well layer; and a cathode electrode in Schottky contact with a surface of a first conductivity type layer that is formed in a surface region of the second well layer apart from the second conductivity type layer and has a lower impurity concentration than the second well layer; wherein the emitter electrode of the IGBT is connected to the anode electrode of the Zener diode.

A semiconductor device according to some embodiments includes an IGBT and a Zener diode that performs protecting the IGBT from surge voltage, the IGBT comprising: a first well layer of a second conductivity type formed in a surface region of a first conductivity type semiconductor layer on a first principal surface of a second conductivity type semiconductor layer; an emitter layer of the first conductivity type selectively formed in a surface region of the first well layer; a gate electrode covering a part of surface of the emitter layer and a part of surface of the first well layer through a gate insulating film; an emitter electrode in contact commonly with the surface of the emitter layer that is not covered with the gate electrode and the surface of the first well layer; and a collector electrode in contact with a second principal surface of the second conductivity semiconductor layer; and the Zener diode comprising: a second well layer of the second conductivity type formed in the surface region of the first conductivity type semiconductor layer on the first principal surface of the second conductivity type semiconductor layer, the second well layer being disposed apart from the first well layer; an anode electrode in ohmic contact with a surface of a second conductivity type layer that is in contact with the second well layer and has a higher impurity concentration than the second well layer; and a cathode electrode in Schottky contact with a surface of a first conductivity type layer that is formed in a surface region of the second well layer apart from the second conductivity type layer and has a lower impurity concentration than the second well layer; wherein the emitter electrode of the IGBT is connected to the anode electrode of the Zener diode.

In some embodiments, the semiconductor device is used in an ignition device for an internal combustion engine.

In some embodiments, a withstand voltage of a Schottky junction formed by Schottky contact with the cathode electrode is at least 2 V.

In some embodiments, the semiconductor device includes a control circuit for controlling output current of the IGBT and a second Zener diode that performs protecting the control circuit from surge voltage/ The second Zener diode can include a third well layer of the second conductivity type in the surface region of the first conductivity type semiconductor layer, the third well layer being disposed apart from the first well layer and the second well layer; a second anode electrode in ohmic contact with a surface of a second conductivity type layer that is in contact with the third well layer and has a higher impurity concentration than the third well layer; a second first conductivity type layer that is formed in a surface region of the third well layer and disposed apart from the second conductivity type layer, and second first conductivity type layer having a lower impurity concentration than the third well layer; and a cathode electrode in Schottky contact with a surface of the second first conductivity type layer; wherein the emitter electrode of the IGBT and the anode electrode of the second Zener diode is connected.

Embodiments of the invention provide a semiconductor device performing a protection function at a low cost, the semiconductor device hardly causing latch-up breakdown even though a vertical type Zener diode is connected between the emitter and the gate of an IGBT.

Embodiments of the invention provide a semiconductor device that causes only minimal latch-up breakdown, at a low cost.

DETAILED DESCRIPTION

Now, some embodiments of a semiconductor device performing surge protection function according to the invention will be described in detail in the following with reference to the accompanying drawings. In the specification and the drawings, a layer prefixed by "n" or "p" means a layer in which electrons or positive holes are majority carriers. The "+" or "−" following the "n" or "p" means relatively high or low impurity concentration.

In the following description of embodiments and accompanying drawings, the same constructions are given the same symbol and redundant description is avoided. The same constructions as those in the conventional technology are also given the same symbol and description is not necessarily repeated.

The accompanying drawings referred to in the description of embodiments are not depicted in actual relative dimensions for the purpose of better recognition and understanding. The present invention should not be limited to the embodiments described in the following within the spirit and scope of the invention.

Figure 1:
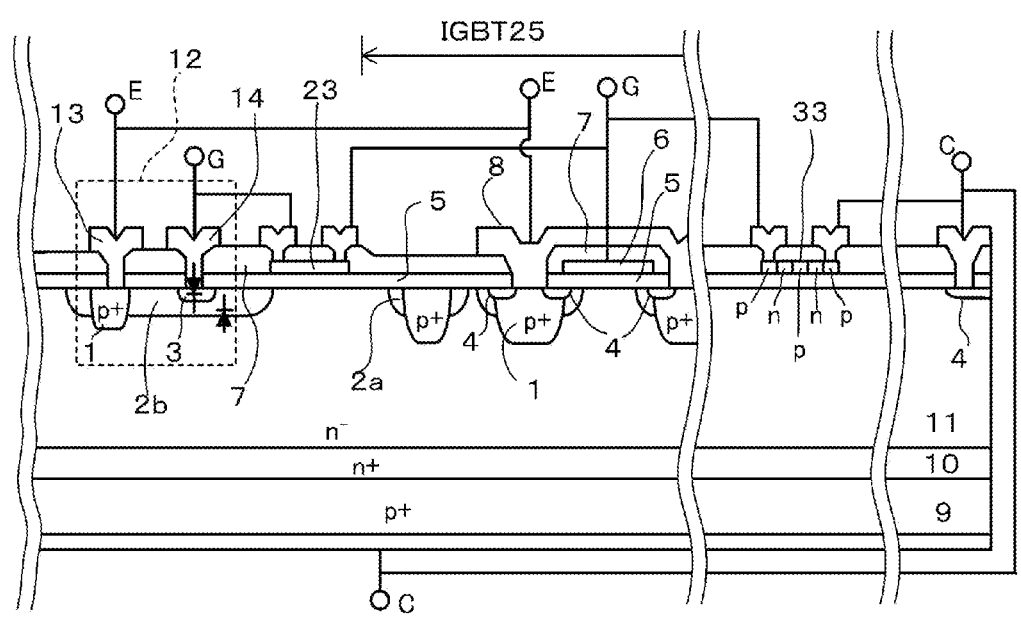
FIG. 1 is a sectional view of an essential part of a semiconductor device performing surge voltage protection function in accordance with embodiments of the invention.

FIG. 1 is a sectional view of an essential part of a semiconductor device performing surge protection function of an embodiment according to the present invention. This semiconductor device comprises a first p well layer 2a for an output stage IGBT and a second p well layer 2b for a Zener diode in the surface region of a semiconductor substrate that is composed of a p substrate 9, and an n$^+$ epitaxial layer 10 and an n$^-$ epitaxial layer 11 deposited on the p substrate 9. The semiconductor device also comprises a p$^+$ layer 1 and an n$^-$ layer 3 in the surface region of the second p well layer 2b for composing a bidirectional Zener diode 12, and p$^+$ layer 1 and an n$^+$ layer 4 (that is an emitter layer) in the surface region of the first p well layer 2a for composing an output stage IGBT 25. The semiconductor device further comprises an oxide film 5 and an interlayer dielectric film 7 on the surface of the semiconductor epitaxial layer substrate including the p$^+$ layer 1, the n$^-$ layer 3, and the n$^+$ layer 4. The oxide film 5 is used in the region of the output stage IGBT 25, as a gate oxide film on which an interlayer dielectric film 7 is provided interposing a gate electrode 6 of a polysilicon layer therebetween. Openings with a predetermined pattern are formed in the oxide film 5 and the interlayer dielectric film 7 on the p$^+$ layer 1 and the n$^-$ layer 3 in the region of bidirectional Zener diode 12 by means of photolithography technique. An anode electrode 13 is formed at the opening on the p$^+$ layer 1 and a cathode electrode 14 is formed at the opening on the n$^-$ layer 3. Thus, the bidirectional Zener diode 12 is fabricated.

The cathode electrode 14 of the bidirectional Zener diode 12 is connected through a gate resistor 23 to the gate terminal of the output stage IGBT 25 with a wiring of a metal electrode film, and the anode electrode 13 is connected to the emitter terminal with a wiring of a metal electrode film.

Figure 6:
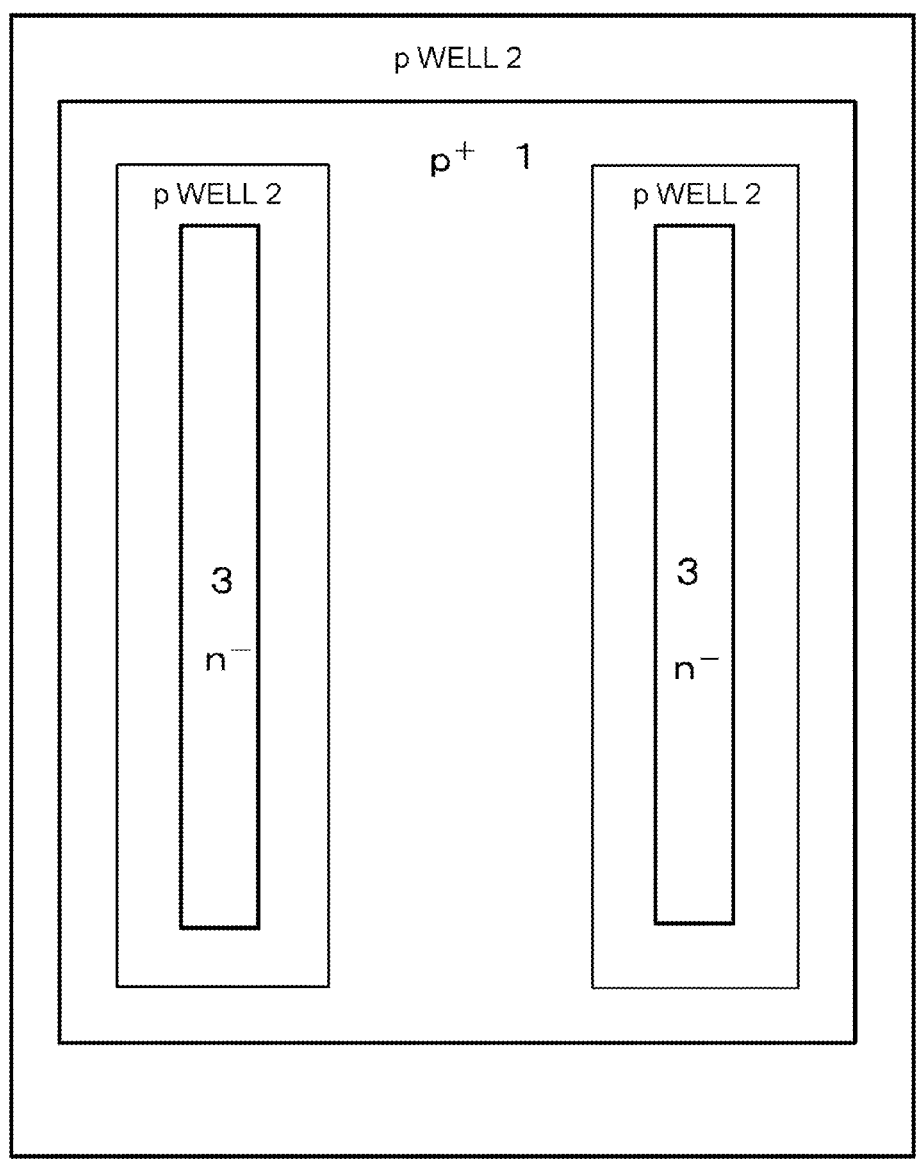
FIG. 6 is an enlarged plan view of a part of a vertical Zener diode of an embodiment of a semiconductor device performing surge voltage protection function in accordance with embodiments of the invention.
Figure 7:
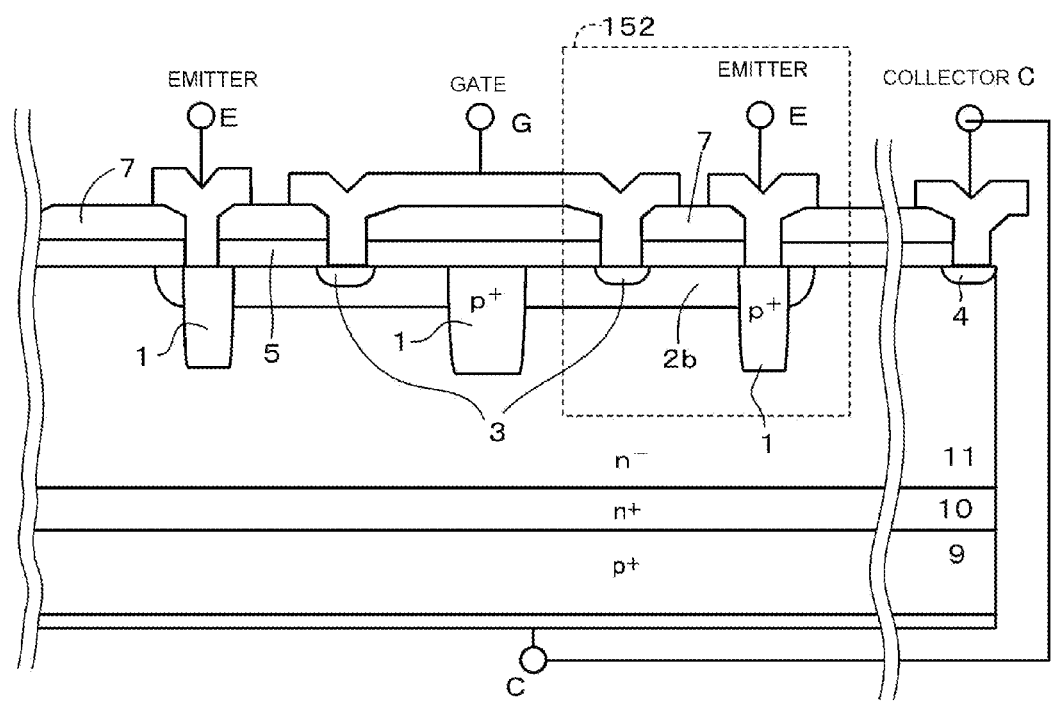
FIG. 7 is a sectional view of a part of a vertical Zener diode of an embodiment of a semiconductor device performing surge voltage protection function in accordance with embodiments of the invention.

FIG. 6 shows a part of a surface pattern of the vertical bidirectional Zener diode 12 that is intended to increase surge voltage withstand capability, and FIG. 7 is a sectional view of that Zener diode 12. In the configuration of FIGS. 6 and 7, the p$^+$ layer 1 is disposed between the n$^-$ layers 3, and n$^-$ layer 3 and the p$^+$ layer 1 are disposed in a second p well layer 2b so that the distance along the surface of the effective PN junction is elongated as long as possible. Thus, the current density per unit area of the PN junction is decreased and the surge voltage withstand capability is increased. Therefore, a structure is achieved in which latching-up breakdown hardly occurs.

Figure 2:
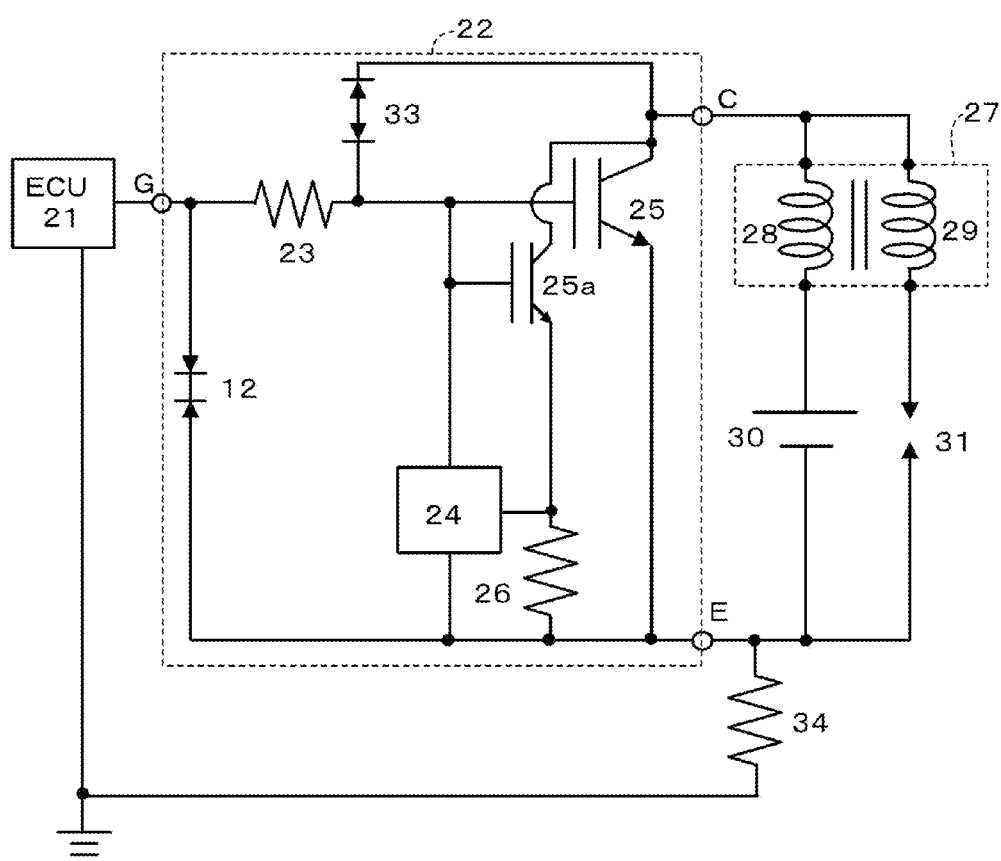
FIG. 2 is a circuit diagram of an ignition device for an internal combustion engine having a semiconductor device performing surge voltage protection function in accordance with embodiments of the invention.
Figure 3A:
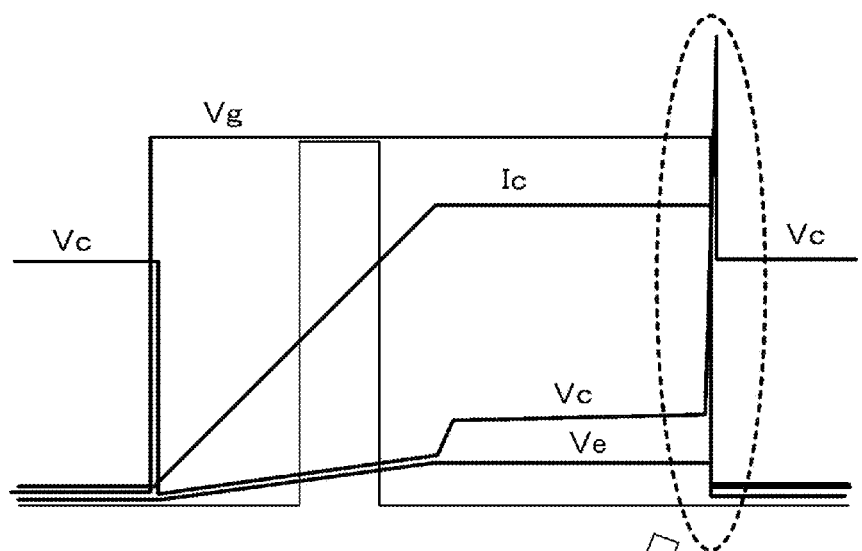
FIGS. 3A and 3B show operational waveforms of an ignition device for an internal combustion engine.
Figure 3B:
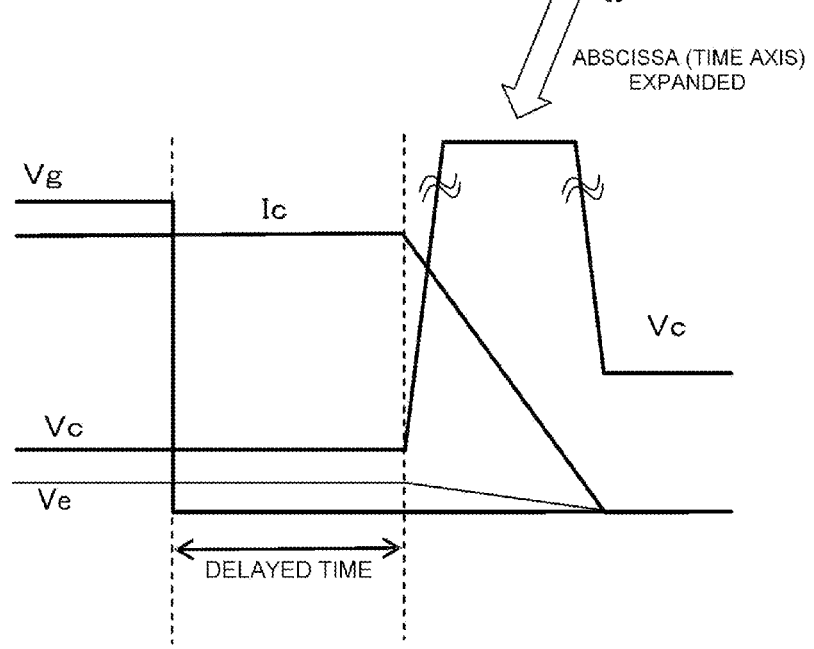
Figure 4:
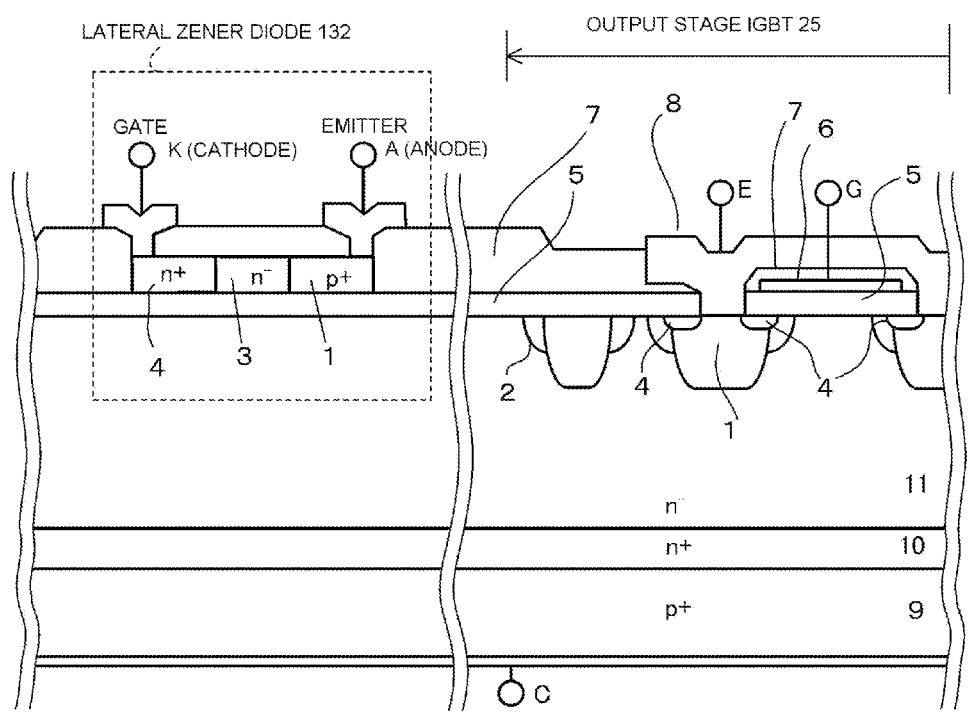
FIG. 4 is a sectional view of a part of a conventional semiconductor device performing surge voltage protection function including a built-in lateral Zener diode.

The above description is about a semiconductor device including a vertical bidirectional Zener diode built-in together with an IGBT. FIG. 2 is a circuit diagram of an ignition device for an internal combustion engine provided with a semiconductor device of the present invention. The circuit of FIG. 2 is different from the circuit of FIG. 9 in that the vertical Zener diode 32 is replaced by the bidirectional Zener diode 12. This circuit has the components in the ignition IC 22 on the same substrate as the output stage IGBT 25 shown in FIG. 1. It is of course possible to form the output stage IGBT 25, the sensing IGBT 25a, and the bidirectional Zener diode 12 on the same substrate and to fabricate the other components on another semiconductor substrate.

The control circuit 24 can be provided with an abnormality detecting circuit that detects abnormality in the collector voltage of the output stage IGBT 25 and in the rise up rate of the coils 28 and 29 and gives a signal to the ECU 21.

(Manufacturing Method)

Figure 9:
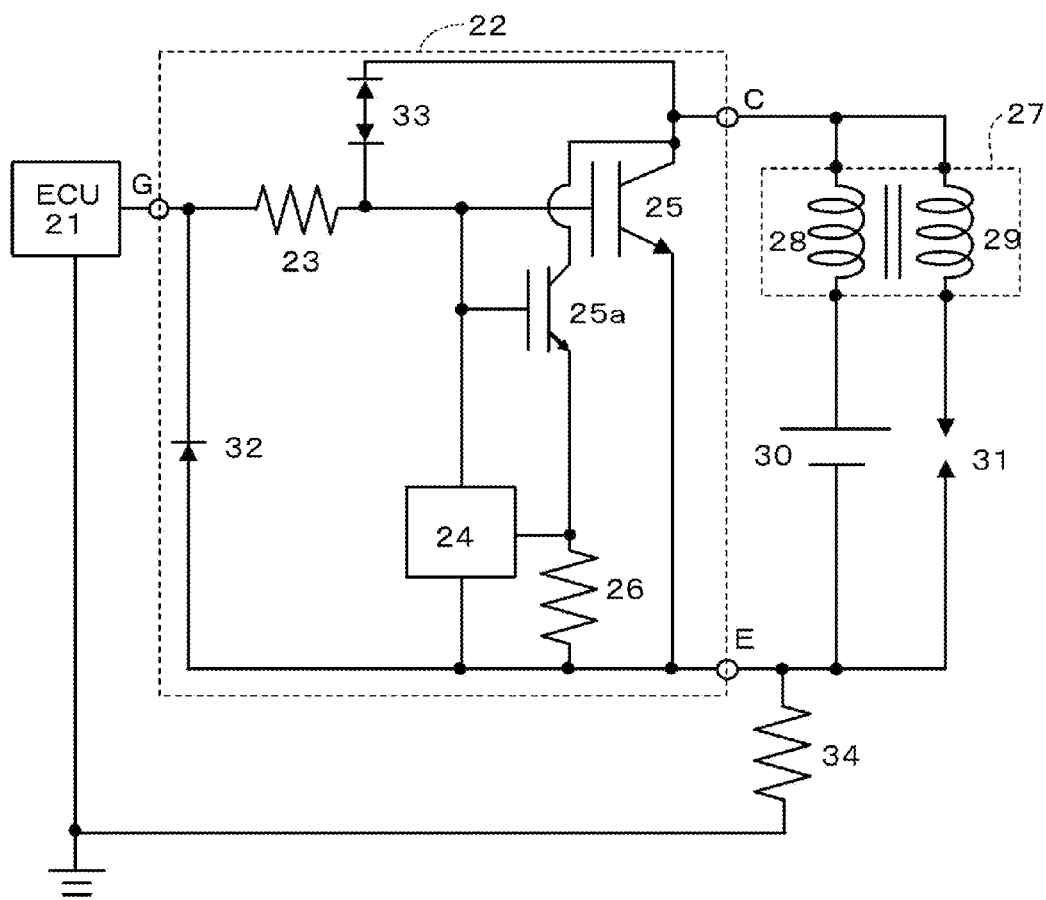
FIG. 9 is a circuit diagram of an ignition device for an internal combustion engine having a semiconductor device performing surge voltage protection function according to the conventional technology.
Figure 10:
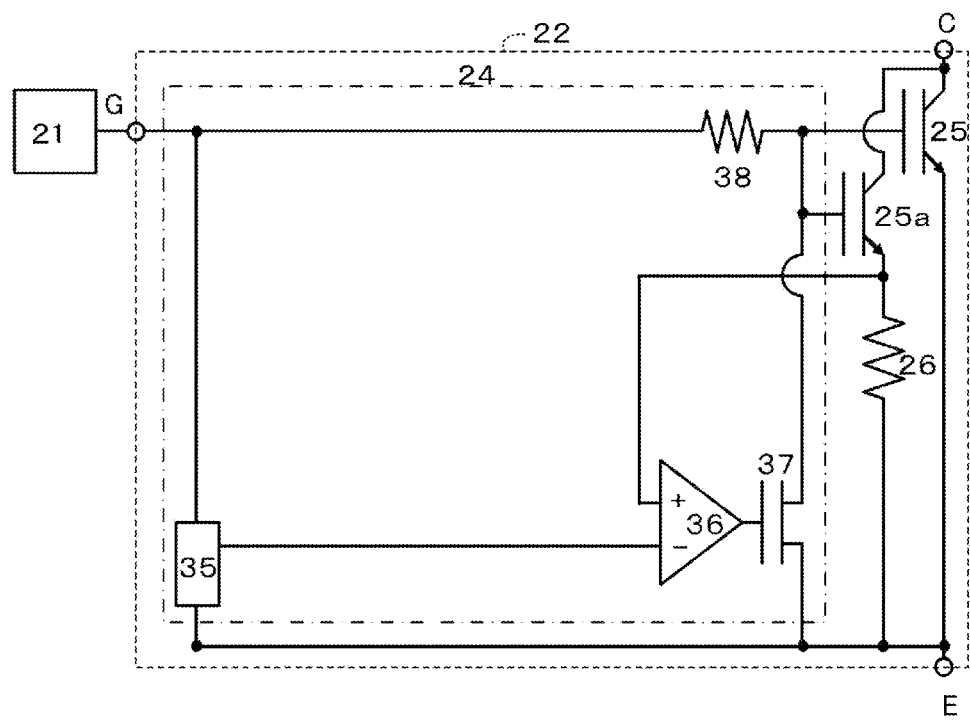
FIG. 10 is a circuit diagram of a control circuit used in an ignition IC for an internal combustion engine.

The ignition IC 22 for an internal combustion engine indicated by the square of dotted lines in FIG. 2 can be manufactured on a semiconductor substrate of a single chip by utilizing known processes of manufacturing the polysilicon resistor 38 and the depletion type MOSFET 37 included in the control circuit 24 in FIG. 10 and producing the vertical Zener diode 32 connected between the emitter and the gate of the output stage IGBT 25 in FIG. 9 with little modifications to the processes.

Figure 14:
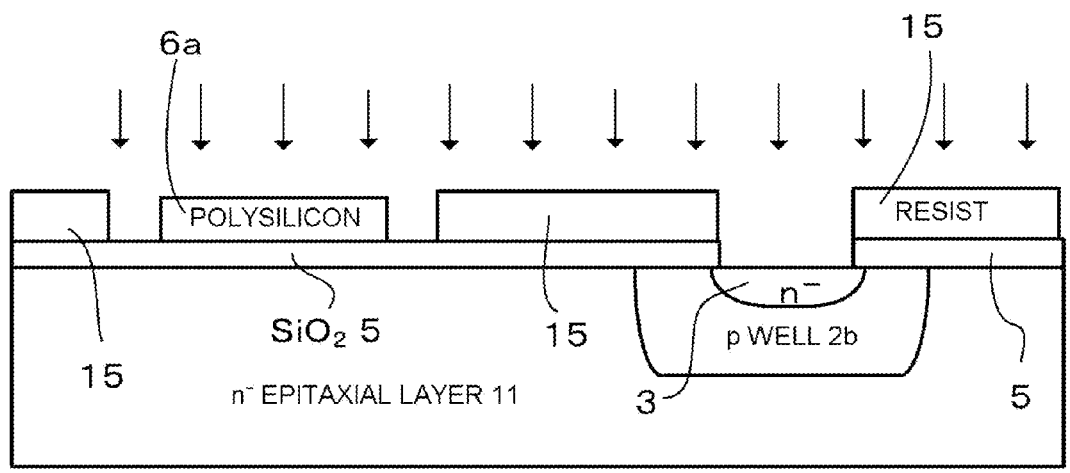
FIG. 14 is a sectional view of a part in a process of manufacturing a vertical Zener diode in accordance with embodiments of the invention.

In the process of forming the polysilicon resistor 38, for example, an SiO$_2$ film 5 is formed on the surface of an n$^-$ epitaxial layer 11 and a polysilicon layer 6a is deposited thereon as shown in FIG. 14. Leaving the polysilicon layer 6a for the polysilicon resistor 38 at predetermined places, other polysilicon layer 6a is removed. After opening a window in the SiO$_2$ film 5 on the surface of the p well layer 2b, phosphor ions are doped to adjust the resistance of the polysilicon layer 6a to an appropriate value by means of ion implantation and diffusion as indicated by the arrows in FIG. 14. This process transforms the polysilicon layer 6a into an n layer of required resistivity, and simultaneously, forms an n$^-$ layer 3 at the opening in the SiO$_2$ film on the surface of the p well layer 2b. This n$^-$ layer 3 can be used for an n$^-$ layer 3 to attain Schottky contact of the cathode electrode 14 of the bidirectional Zener diode 12 shown in FIG. 1.

Figure 5:
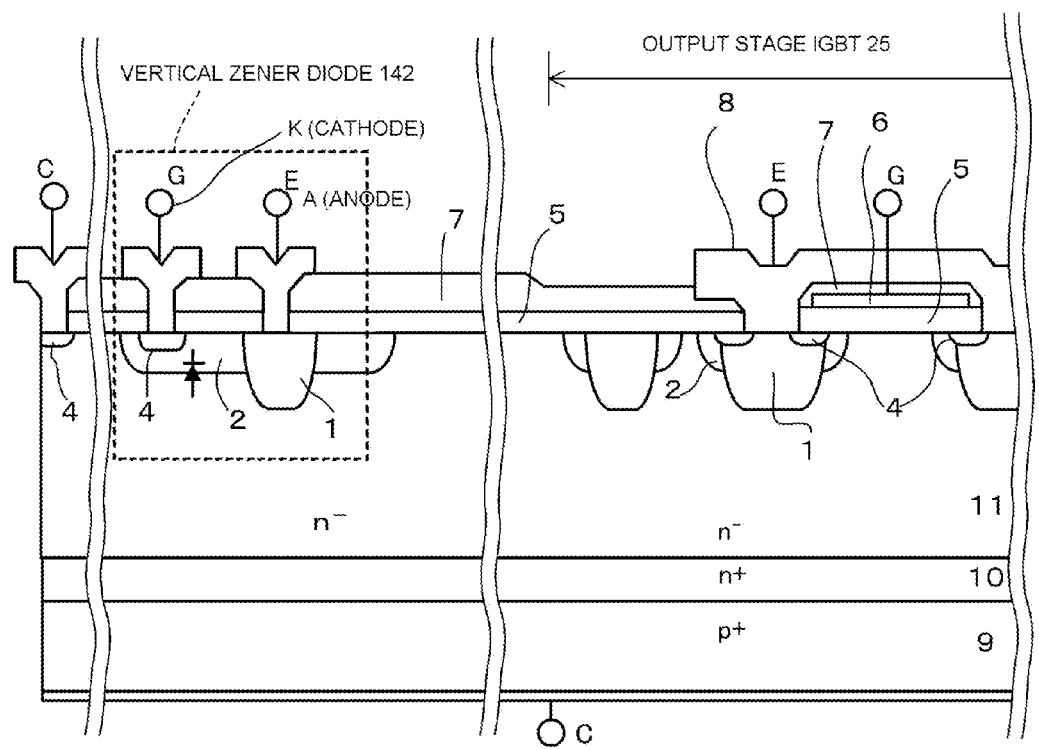
FIG. 5 is a sectional view of a part of a conventional semiconductor device performing surge protection function including a built-in vertical Zener diode.
Figure 12A:
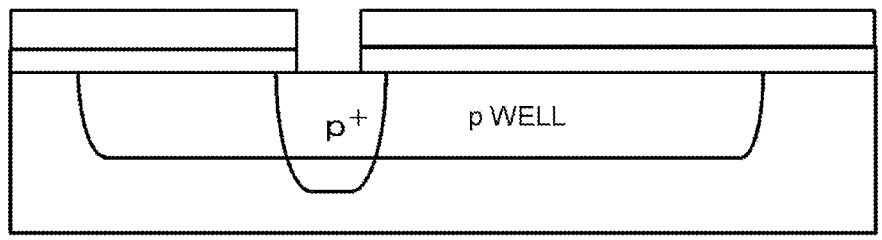
FIGS. 12A and 12B show a manufacturing process of a vertical Zener diode in accordance with embodiments of the invention.
Figure 12B:
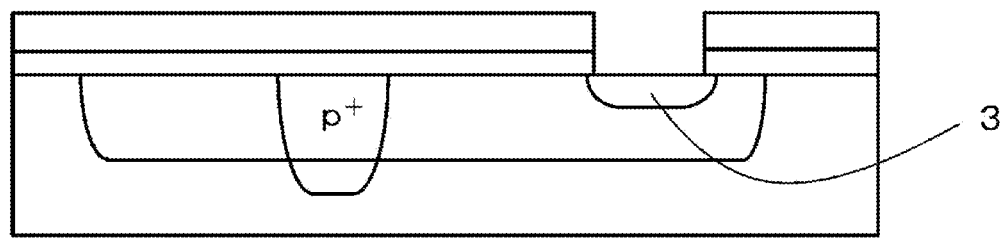

When the process of manufacturing the conventional vertical Zener diode shown in FIG. 5 is utilized, as shown in FIGS. 12A and 12B, the process of forming the n$^+$ layer 4 (in FIG. 5) of the conventional vertical Zener diode 142 is omitted and instead, a process of forming an n$^-$ layer 3 is added. Simultaneously with the step of forming an emitter electrode 8 of the IGBT 25, using a main material of aluminum alloy, formed are a cathode electrode 14 in a Schottky contact with the surface of the n$^-$ layer 3 and an anode electrode 13 in an ohmic contact with the surface of the p$^+$ layer 1. Other manufacturing processes can be carried out utilizing the same processes as in manufacturing a conventional vertical Zener diode to manufacture a bidirectional Zener diode 12 of the invention.

Figure 13A:
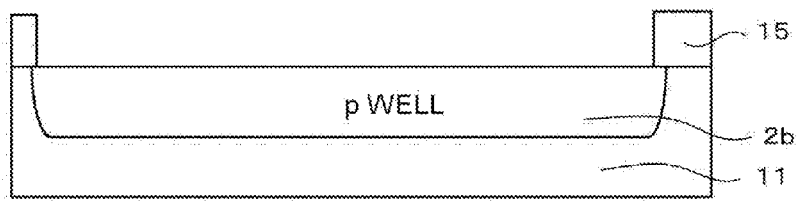
FIGS. 13A through 13E show a conventional manufacturing process of a depletion type MOSFET.
Figure 13B:
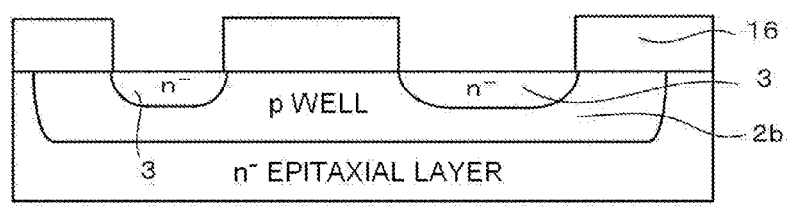
Figure 13C:
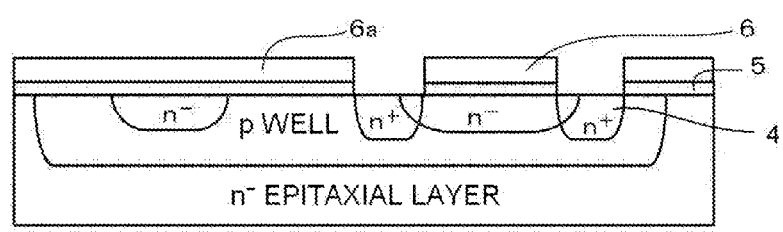
Figure 13D:
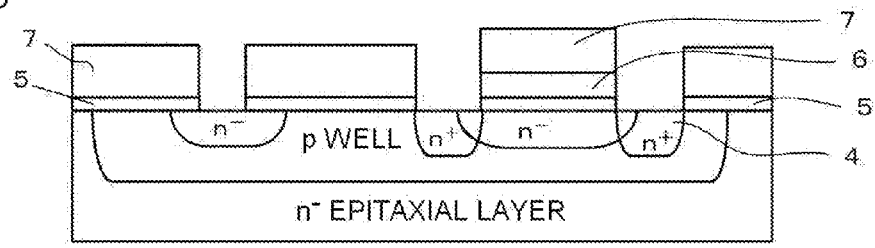
Figure 13E:
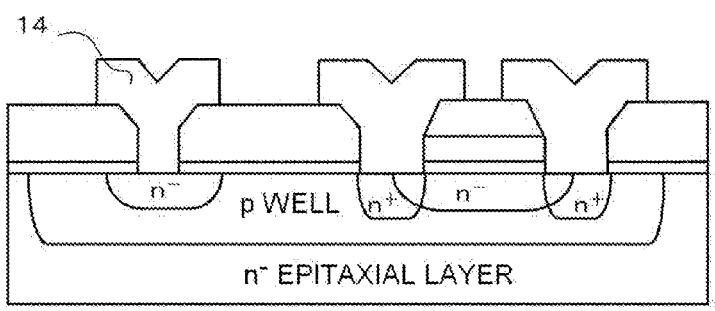

FIGS. 13A through 13E illustrate utilization of a conventional process of manufacturing a depletion type MOSFET having the gate and the source short-circuited. The first process of manufacturing a depletion type MOSFET is forming a second p well layer 2b on the surface of an n$^-$ epitaxial layer 11 using a mask of resist 15 as shown in FIG. 13A. Then as shown in FIG. 13B, an n$^-$ layer 3, which becomes a channel region, is formed in the second p well layer 2b using the mask of resist 16. In the step shown in FIG. 13C, an n$^+$ layer 4 is formed using the oxide film 5, polysilicon layer 6a, and the gate electrode 6 as masks to obtain an n type source and drain. In the process shown in FIG. 13D, the polysilicon layer 6a is removed leaving the gate electrode 6, an interlayer dielectric film 7 is coated, and openings are formed at the position of n$^+$ source-drain and the n$^-$ layer 3. Then in the step of FIG. 13E, an electrode metallic film of aluminum alloy is deposited by evaporation to form electrodes. Thus, an n$^-$ layer 3 of a vertical bidirectional Zener diode 12 can be fabricated utilizing just the same process to fabricate a depletion type MOSFET. In the step of FIG. 13D, after forming the oxide film 5 and the interlayer dielectric film 7, openings are formed in the oxide film 5 and the interlayer dielectric film 7 on the surface of the n$^-$ layer 3 for forming electrode metallic film. This is a step in manufacturing a depletion type MOSFET, which is utilized in the process of manufacturing a vertical type bidirectional Zener diode of the present invention. Thus, a process of forming a Schottky junction between the cathode electrode 14 and the n$^-$ layer 3 in the present invention can be carried out at a low cost without adding any new process to the conventional process.

Figure 8:
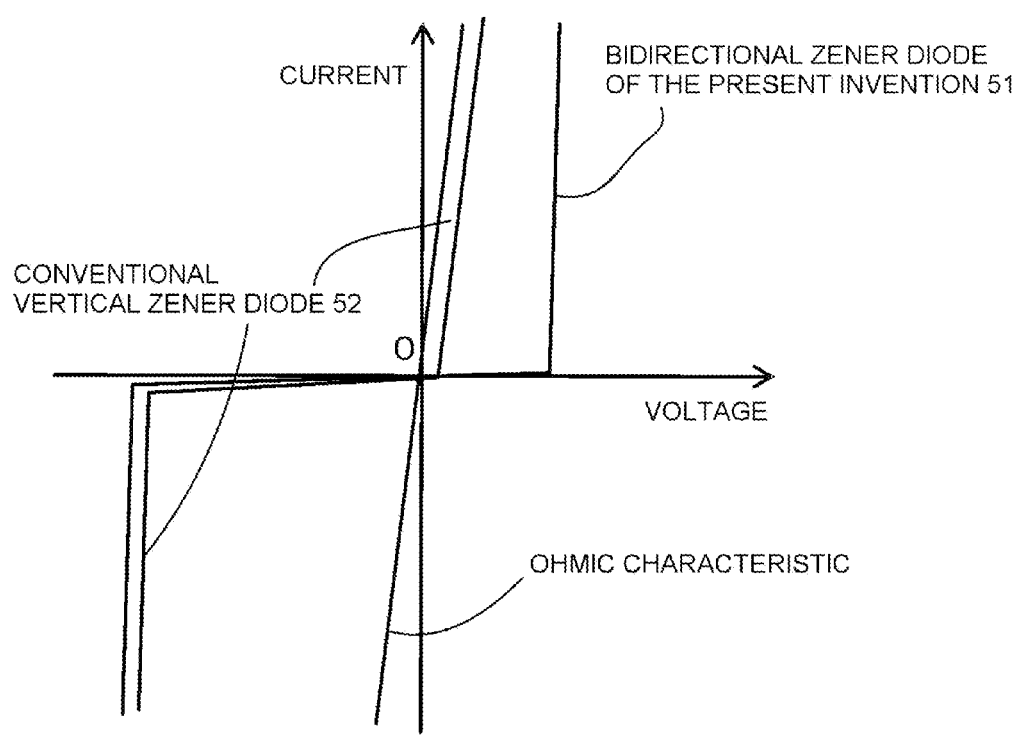
FIG. 8 shows current-voltage waveforms for the cases of: a Zener diode according to embodiments of the invention, a Zener diode according to the conventional technology, and an ohmic contact.

In a semiconductor device performing protection function according to the present invention, a Schottky junction is necessarily formed between a metallic electrode and the n⁻ layer 3 of the vertical bidirectional Zener diode 12 in the manufacturing process described above. To form the n⁻ layer 3 of the vertical bidirectional Zener diode 12, the element of ion implantation of arsenic or phosphorus is used in a dose amount of impurity concentration not larger than $1 \times 10^{17}/cm^3$ at the interface of the junction for obtaining a Schottky junction. To form the Schottky junction, a voltage-withstanding characteristic in the forward direction as well as in the reverse direction is given between the n⁻ layer 3 and the metallic gate electrode of an aluminum alloy such as Al—Si or Al—Si—Cu as shown in FIG. 8 by the current-voltage characteristic curve 51 for a bidirectional Zener diode 12 of the invention. This construction produces a bidirectional Zener diode exhibiting the forward withstand voltage as well as a reverse withstand voltage equivalent to the reverse withstanding voltage of a conventional vertical Zener diode shown by the current-voltage characteristic curve 52 in FIG. 8. When this bidirectional Zener diode is used, even though the emitter potential in the output stage IGBT 25 region rises over the built-in voltage (0.7 V for example) between the p well layer 2a and the n⁻ layer 3, a parasitic thyristor does not turn ON because the withstand voltage in the forward direction of the bidirectional Zener diode is larger than 0.7 V. Therefore, the gate terminal does not break down improving a surge voltage withstanding capability.

Figure 11:
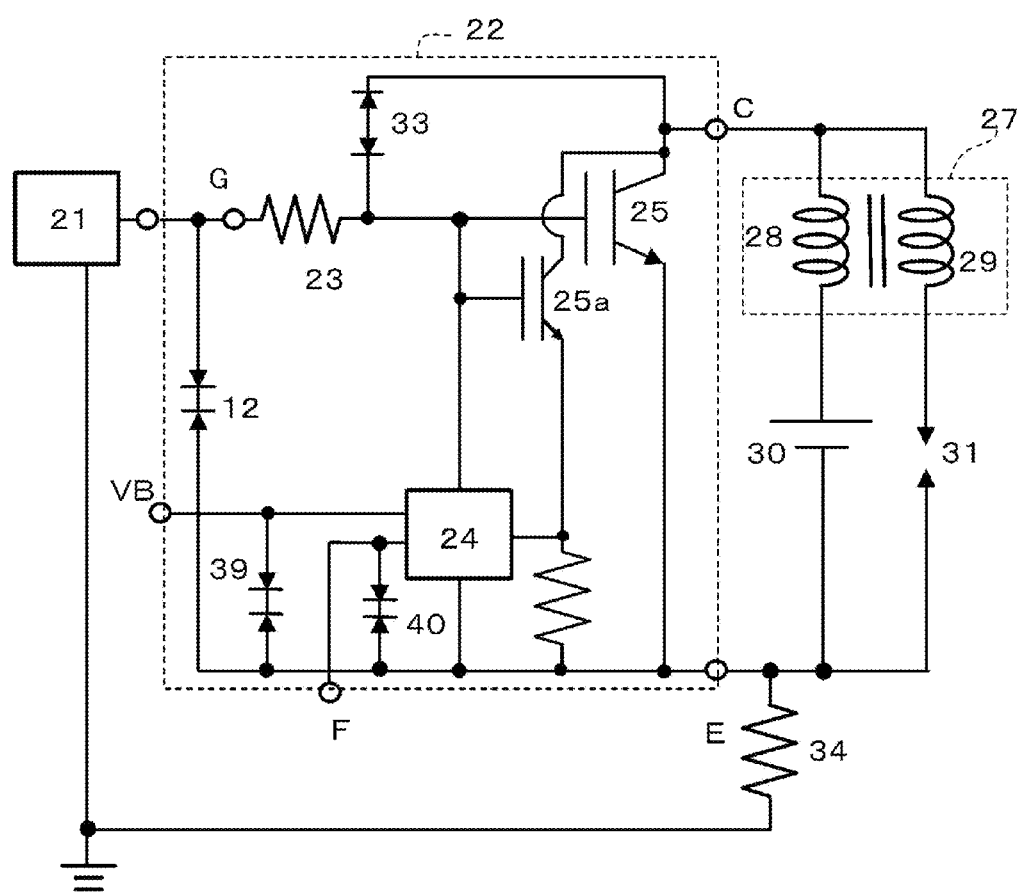
FIG. 11 is a circuit diagram including functional circuits that are added to a conventional circuit of an ignition device for an internal combustion engine provided with a semiconductor device performing surge voltage protection function.

In the description about the embodiment thus far, the gate terminal of the output stage IGBT 25 is protected from the surge voltage by the bidirectional Zener diode 12. However, as shown in FIG. 11, bidirectional Zener diodes for protecting the control circuit 24 can be obtained at a lower cost than conventional technologies by employing bidirectional Zener diodes 39 and 40. The bidirectional Zener diode 39 is connected between the VB terminal of the control circuit 24 and the low potential side, which are 131 and 134 in FIGS. 15A and 15B, connected to the emitter terminal E; the bidirectional Zener diode 40 is connected between the F terminal of the control circuit 24 and the low potential side of the control circuit 24. The VB terminal is an input terminal at the high voltage side of a DC power supply for the controller circuit 24. The F terminal delivers signals of abnormality in the collector voltage of the output stage IGBT 25 and abnormality of the coils 28 and 29 to the ECU 21.

Although the control circuit 24 and the bidirectional Zener diodes 39 and 40 are installed in the ignition IC 22 in the configuration of FIG. 11, the control circuit 24 and the bidirectional Zener diodes 39 and 40 can be formed in a separated semiconductor substrate from the ignition IC 22.

Figure 15A:
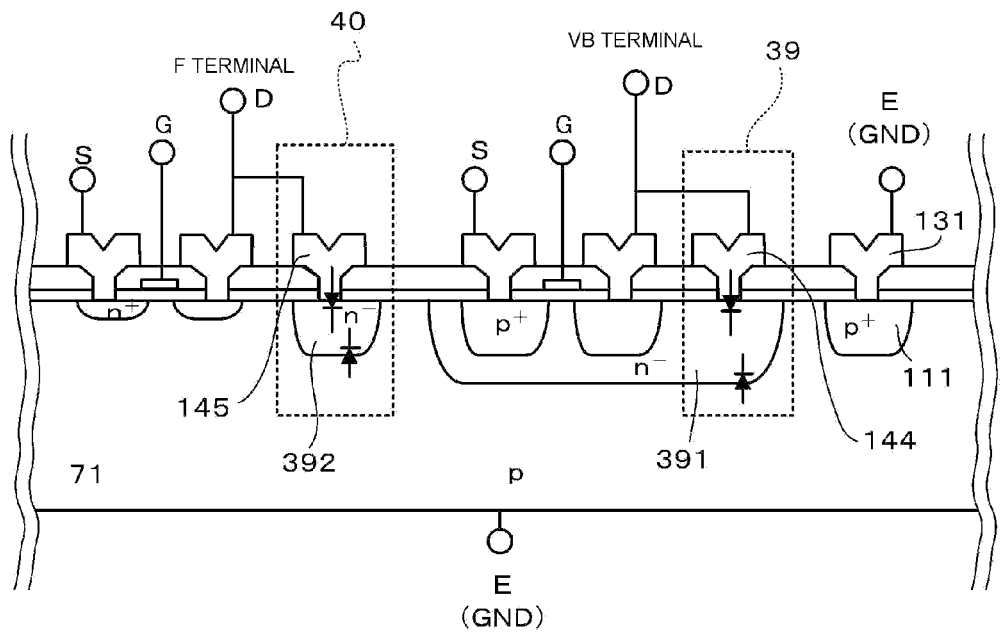
FIGS. 15A and 15B are sectional views of essential parts of vertical Zener diodes in accordance with embodiments of the invention.
Figure 15B:
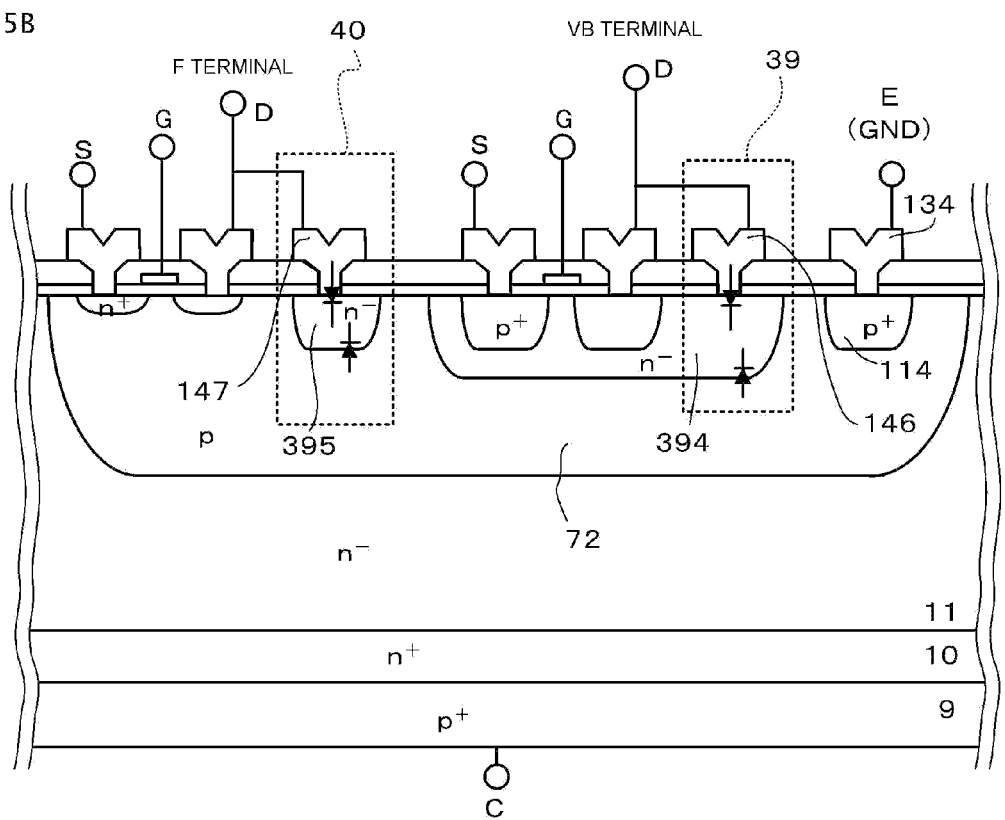

FIGS. 15A and 15B are sectional views of an essential part of vertical Zener diodes according to the present invention showing a MOSFET composing a control circuit 24 and bidirectional Zener diodes 39 and 40. FIG. 15A shows that the control circuit 24 is formed on a separate semiconductor substrate from the one for an output stage IGBT 25; and FIG. 15B shows that the control circuit 24 is formed on the same semiconductor substrate for the output stage IGBT 25.

In the construction of the bidirectional Zener diode 39 shown in FIG. 15A, an n type well layer 391 is formed in the surface region of a p type semiconductor substrate 71. A cathode electrode 144 is formed so as to form a Schottky junction with the well layer 391. In the construction of the bidirectional Zener diode 40, an n type well layer 392 is formed in the surface region of the p type semiconductor substrate 71. A cathode electrode 145 is formed so as to form a Schottky junction with the well layer 392. A p⁺ layer 111 is also formed on the surface region of the semiconductor substrate 71. An anode electrode 131 is formed in ohmic contact with the p⁺ layer 111. The anode electrode 131 is connected to the emitter electrode of the output stage IGBT 25.

FIG. 15B shows bidirectional Zener diodes 39 and 40, which are not illustrated in FIG. 1. The bidirectional Zener diodes 39 and 40 are formed on a semiconductor substrate composed of a p substrate 9, an n⁺ epitaxial layer 10, and an n⁻ epitaxial layer 11, the latter two layers being epitaxially grown on the p substrate 9. This semiconductor substrate has the same construction as the one in FIG. 1, but the bidirectional Zener diodes 39 and 40 are formed on the surface region of the semiconductor substrate apart from the region for the output stage IGBT 25 and the bidirectional Zener diode 12. The bidirectional Zener diodes 39 and 40 are formed in a p type well layer 72 formed in the surface region of the n⁻ epitaxial layer 11.

In the construction of the bidirectional Zener diode 39, an n type well layer 394 is formed in the surface region of the p type well layer 72. A cathode electrode 146 is formed so as to form a Schottky junction with the well layer 394. In the construction of the bidirectional Zener diode 40, an n type well layer 395 is formed in the surface region of the p type well layer 72. A cathode electrode 147 is formed so as to form a Schottky junction with the well layer 395. In the surface region of the well layer 72, a p⁺ layer 114 is also formed, at which an anode electrode 134 is formed in ohmic contact with the p⁺ layer 114. This anode electrode 134 is connected to the emitter electrode 8 of the output stage IGBT 25.

To obtain a Schottky junction, the well layers 391, 392, 394, and 395 are formed with a dose amount of impurity concentration at most $1 \times 10^{17}/cm^3$ at the junction interface.

The semiconductor substrate in the above description is composed of a p substrate 9, and an n⁺ epitaxial layer 10 and an n⁻ epitaxial layer 11 grown on the p substrate 9. The semiconductor substrate can be, however, composed of an n type semiconductor substrate 11, and an n type layer 10 and a p type layer 9 formed by ion implantation and diffusion. Such a semiconductor substrate also provides the same effects.

Embodiments according to the invention described thus far achieve a small size and small device area. Because the fabrication process for a device of the invention can utilize a process for manufacturing a control circuit and steps for fabricating a lateral polysilicon Zener diode, an IGBT performing surge voltage protecting function of the present invention can be manufactured at a low cost without increasing the number of steps. Since the protecting Zener diode exhibits bidirectional voltage withstanding performance, a protective semiconductor device has been obtained performing improved surge voltage withstanding capability against a large dv/dt surge voltage like conventional electrostatic discharge (ESD).

This application is based on, and claims priority to, Japanese Patent Application No. 2012-083931, filed on Apr. 2, 2012, the contents of which are incorporated herein by reference in their entirety.

What is claimed is:
1. A semiconductor device comprising:
an IGBT and a Zener diode that protects the IGBT from a surge voltage, the IGBT comprising:
a first well layer of a second conductivity type formed in a surface region of a first conductivity type semiconductor layer on a first principal surface of a second conductivity type semiconductor layer;
an emitter layer of the first conductivity type selectively formed in a surface region of the first well layer;

a gate electrode covering a part of surface of the emitter layer and a part of surface of the first well layer through a gate insulating film;

an emitter electrode in contact commonly with the surface of the emitter layer that is not covered with the gate electrode and the surface of the first well layer; and a collector electrode in contact with a second principal surface of the second conductivity semiconductor layer; and the Zener diode comprising:

a second well layer of the second conductivity type formed in the surface region of the first conductivity type semiconductor layer on the first principal surface of the second conductivity type semiconductor layer, the second well layer being disposed apart from the first well layer;

an anode electrode in ohmic contact with a surface of a second conductivity type layer that is in contact with the second well layer and has a higher impurity concentration than the second well layer; and a cathode electrode in Schottky contact with a surface of a first conductivity type layer that is formed in a surface region of the second well layer apart from the second conductivity type layer and has a lower impurity concentration than the second well layer;

wherein the emitter electrode of the IGBT is connected to the anode electrode of the Zener diode.

2. The semiconductor device according to claim 1, wherein the semiconductor device is used in an ignition device for an internal combustion engine.

3. The semiconductor device according to claim 2, wherein a withstand voltage of a Schottky junction formed by Schottky contact with the cathode electrode is at least 2 V.

4. The semiconductor device according to claim 1, wherein the semiconductor device comprises a control circuit for controlling output current of the IGBT and a second Zener diode that performs protecting the control circuit from surge voltage;

the second Zener diode comprising:

a third well layer of the second conductivity type in the surface region of the first conductivity type semiconductor layer, the third well layer being disposed apart from the first well layer and the second well layer;

a second anode electrode in ohmic contact with a surface of a second conductivity type layer that is in contact with the third well layer and has a higher impurity concentration than the third well layer;

a second first conductivity type layer that is formed in a surface region of the third well layer and disposed apart from the second conductivity type layer, and second first conductivity type layer having a lower impurity concentration than the third well layer; and a cathode electrode in Schottky contact with a surface of the second first conductivity type layer;

wherein the emitter electrode of the IGBT and the anode electrode of the second Zener diode is connected.

5. The semiconductor device according to claim 2, wherein the semiconductor device comprises a control circuit for controlling output current of the IGBT and a second Zener diode that performs protecting the control circuit from surge voltage;

the second Zener diode comprising:

a third well layer of the second conductivity type in the surface region of the first conductivity type semiconductor layer, the third well layer being disposed apart from the first well layer and the second well layer;

a second anode electrode in ohmic contact with a surface of a second conductivity type layer that is in contact with the third well layer and has a higher impurity concentration than the third well layer;

a second first conductivity type layer that is formed in a surface region of the third well layer and disposed apart from the second conductivity type layer, and second first conductivity type layer having a lower impurity concentration than the third well layer; and a cathode electrode in Schottky contact with a surface of the second first conductivity type layer;

wherein the emitter electrode of the IGBT and the anode electrode of the second Zener diode is connected.

6. The semiconductor device according to claim 3, wherein the semiconductor device comprises a control circuit for controlling output current of the IGBT and a second Zener diode that performs protecting the control circuit from surge voltage;

the second Zener diode comprising:

a third well layer of the second conductivity type in the surface region of the first conductivity type semiconductor layer, the third well layer being disposed apart from the first well layer and the second well layer;

a second anode electrode in ohmic contact with a surface of a second conductivity type layer that is in contact with the third well layer and has a higher impurity concentration than the third well layer;

a second first conductivity type layer that is formed in a surface region of the third well layer and disposed apart from the second conductivity type layer, and second first conductivity type layer having a lower impurity concentration than the third well layer; and a cathode electrode in Schottky contact with a surface of the second first conductivity type layer;

wherein the emitter electrode of the IGBT and the anode electrode of the second Zener diode is connected.

* * * * *